(12) United States Patent
Yen et al.

(10) Patent No.: US 10,018,225 B1
(45) Date of Patent: Jul. 10, 2018

(54) SUPPORTING DEVICE

(71) Applicant: SYNCMOLD ENTERPRISE CORP., New Taipei (TW)

(72) Inventors: Ching-Hui Yen, New Taipei (TW); Chen-Kuei Tsai, New Taipei (TW)

(73) Assignee: Syncmold Enterprise Corp., New Taipei (TW)

(*) Notice: Subject to any disclaimer, the term of this patent is extended or adjusted under 35 U.S.C. 154(b) by 0 days.

(21) Appl. No.: 15/702,289

(22) Filed: Sep. 12, 2017

(30) Foreign Application Priority Data

Mar. 1, 2017 (TW) .............................. 106202885 U

(51) Int. Cl.
*H05K 5/00* (2006.01)
*F16C 29/02* (2006.01)
*F16M 11/04* (2006.01)
*F16C 29/10* (2006.01)
*F16C 33/10* (2006.01)
*H05K 5/02* (2006.01)

(52) U.S. Cl.
CPC .............. *F16C 29/02* (2013.01); *F16C 29/10* (2013.01); *F16C 33/1095* (2013.01); *F16M 11/046* (2013.01); *H05K 5/0234* (2013.01)

(58) Field of Classification Search
CPC ........ F16M 11/08; F16M 11/046; H05K 5/00; F16C 29/02
See application file for complete search history.

(56) References Cited

U.S. PATENT DOCUMENTS

| 6,216,989 | B1* | 4/2001 | Shioya | F16M 11/10 248/122.1 |
| 8,313,074 | B2* | 11/2012 | Wang | F16M 11/105 248/157 |
| 8,908,360 | B2* | 12/2014 | Kondo | F16M 11/08 361/679.06 |
| 8,950,725 | B2* | 2/2015 | Huang | F16M 11/105 248/121 |

* cited by examiner

*Primary Examiner* — Amy Jo Sterling
(74) *Attorney, Agent, or Firm* — Muncy, Geissler, Olds & Lowe, P.C.

(57) ABSTRACT

A supporting device is disclosed, which comprises a support; a slider including at least one self-lubricating block; a pressing block disposed at the second opening, abutting the inner side of the second opening, and fixed on the slider so that the slider may tightly abut against the support through the self-lubricating block; and an elastic element disposed between the support and the slider. When a force is applied to the slider, the slider may move between a highest position and a lowest position with respect to the support while the self-lubricating block rubs the support. When the force is removed, the slider may stop at any vertical height with respect to the support.

14 Claims, 8 Drawing Sheets

SUPPORTING DEVICE

CROSS REFERENCE TO RELATED APPLICATION

This application claims the benefits of the Taiwan Patent Application Serial Number 106202885, filed on Mar. 1, 2017, the subject matter of which is incorporated herein by reference.

BACKGROUND OF THE INVENTION

1. Field of the Invention

The present invention relates to a supporting device. More particularly, the present invention relates to an elevatable supporting device for supporting a display device.

2. Description of Related Art

A stand known in the art usually comprises a base, a support, and a slider disposed on the base and moving along the support. The display device is mounted on the slider so that the vertical position of the display device may be adjusted. Generally, the support may include at least one slide, and the slide known in the art is a linear slide with a plurality of rolling balls. The linear slide usually includes an outer rail, an inner rail, and a ball lining configured between the outer rail and the inner rail. Therefore, when the display device is fastened to the inner rail or mounted on the slider, the slider and the display device may move up and down along the stand through the linear slide. In addition, an elastic element may be disposed between the slider and the support for providing an elastic force that may sustain the weight of the display device so that the display device may stop at any height with respect to the stand.

However, the manufacturing cost of the aforementioned elevatable stand is increased due to the complex assembly process with many components.

Accordingly, the present invention is a supporting device with a novel structure which may reduce the number of the assembly parts and simplify the assembly process. Thus, the appearance of the stand of the present invention is slimmer than the aforementioned elevatable stand.

SUMMARY OF THE INVENTION

To achieve the object, the supporting device of the present invention comprises a support including a shell, an accommodating space, a first opening, and a second opening; wherein the shell surrounds the accommodating space, the first opening and the second opening face opposite directions and interconnect with the accommodating space; the shell includes a first protruding rib, a second protruding rib, a first surface, a second surface, and a third surface corresponding to the accommodating space, wherein the first protruding rib and the second protruding rib protrude toward the accommodating space, the first surface, the second surface, and the third surface are sequentially connected, the second surface is formed between the first protruding rib and the second protruding rib, the first surface is formed on the first protruding rib and adjacent to the second surface, and the third surface is formed on the second protruding rib and adjacent to the second surface; a slider including a main part, an elongated arm, and at least one self-lubricating block, the main part is disposed between the first protruding rib and the second protruding rib, the self-lubricating block is disposed between the main part and the shell and contact with the shell, the elongated arm is connected to the main part and protrudes out of the support through the first opening; and an elastic element disposed between the slider and the support; wherein when a force is applied to the slider, the self-lubricating block rubs the support so that the slider slides between a highest position and a lowest position with respect to the support, and the slider stops at any height with respect to the support when the force is removed.

In one embodiment, the self-lubricating block contact with the first surface, the second surface, or the third surface of the support.

In one embodiment, the supporting device further comprises a pressing block being disposed at a dovetail zone of the accommodating space, wherein the dovetail zone is adjacent to the second opening and tapered toward the first opening, and the shell further includes two inclined fourth surfaces corresponding to the dovetail zone and opposing to each other.

In one embodiment, the pressing block abuts against the fourth surface of the shell and is fixed to the main part of the slider through a connecting element so that the self-lubricating block tightly abuts against the shell. The connecting element is a bolt, the bolt passes through the pressing block and plugs into the main part of the slider.

In one embodiment, the supporting device further comprises a spring being disposed between the pressing block and the slider.

In one embodiment, the slider further includes a convex portion, wherein the convex portion is formed on a concave portion under the main part for the spring being sleeved thereon.

In one embodiment, the support further comprises a first plate being disposed at the first opening, the shell further comprises a third protruding rib being adjacent to the first opening, wherein the first plate is engaged to the third protruding rib.

In one embodiment, the support further comprises a second plate being disposed at the second opening, the shell further comprises a fourth protruding rib being adjacent to the second opening, wherein the second plate is engaged with the fourth protruding rib.

In one embodiment, the elastic element is a constant force spring having a winding portion and a free end corresponding to the winding portion, the support further comprises a supporting base, wherein the winding portion is accommodated on the supporting base and the free end is fixed to the slider and moves with the slider.

In one embodiment, the support is an elongated plate prepared through aluminum extrusion and bending, wherein the elongated plate includes a plurality of protruding ribs which is integrally formed.

In one embodiment, the main part further includes at least one engaging structure, the self-lubricating block is embedded in the engaging structure so that the self-lubricating block is engaged with the main part.

In one embodiment, the supporting device further comprises a connecting base being pivoted with the slider so that the connecting base is rotatable with respect to the slider.

In one embodiment, a material of the self-lubricating block is selected from the group consisting of polyaryletherketone, polyethylene, and modified polyethylene.

DETAILED DESCRIPTION OF THE PREFERRED EMBODIMENT

Hereafter, examples will be provided to illustrate the embodiments of the present invention. Advantages and effects of the invention will become more apparent from the disclosure of the present invention. It should be noted that these accompanying figures are simplified and illustrative. The quantity, shape, and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Figure 1:
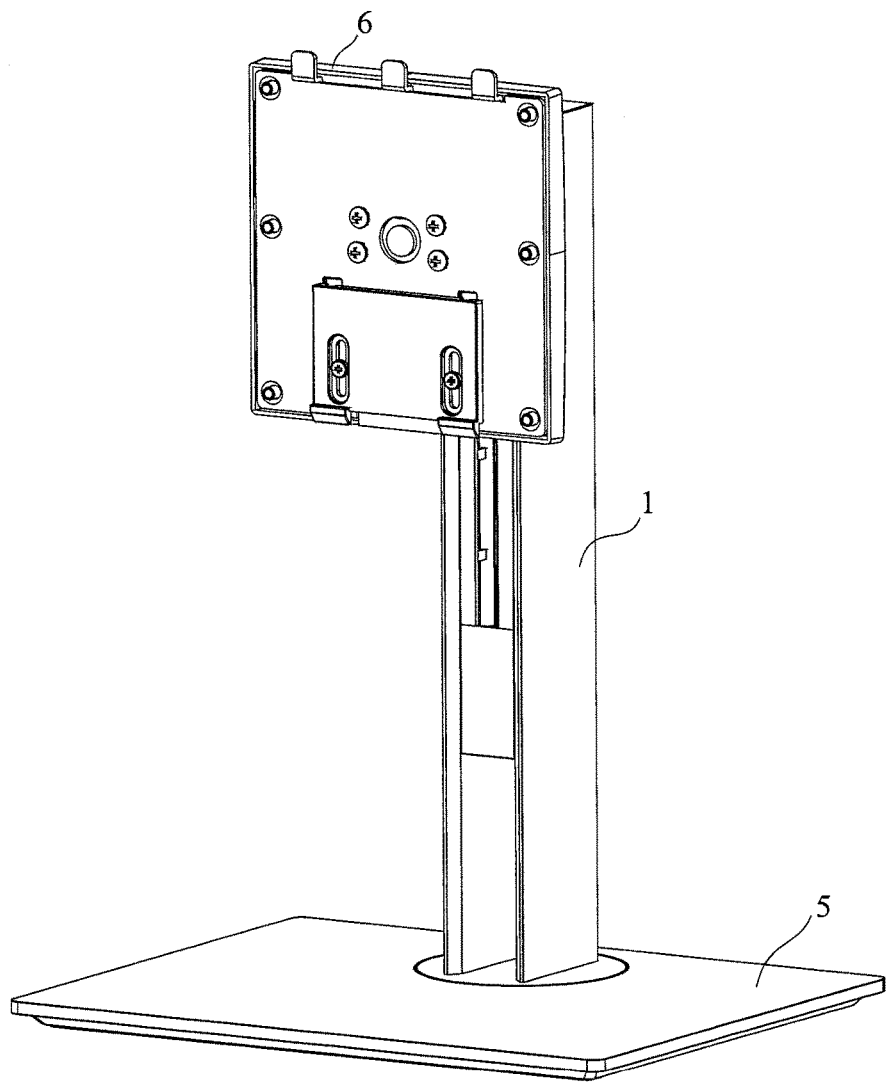
FIG. 1 is a perspective view of the supporting device of one embodiment of the present invention.
Figure 2:
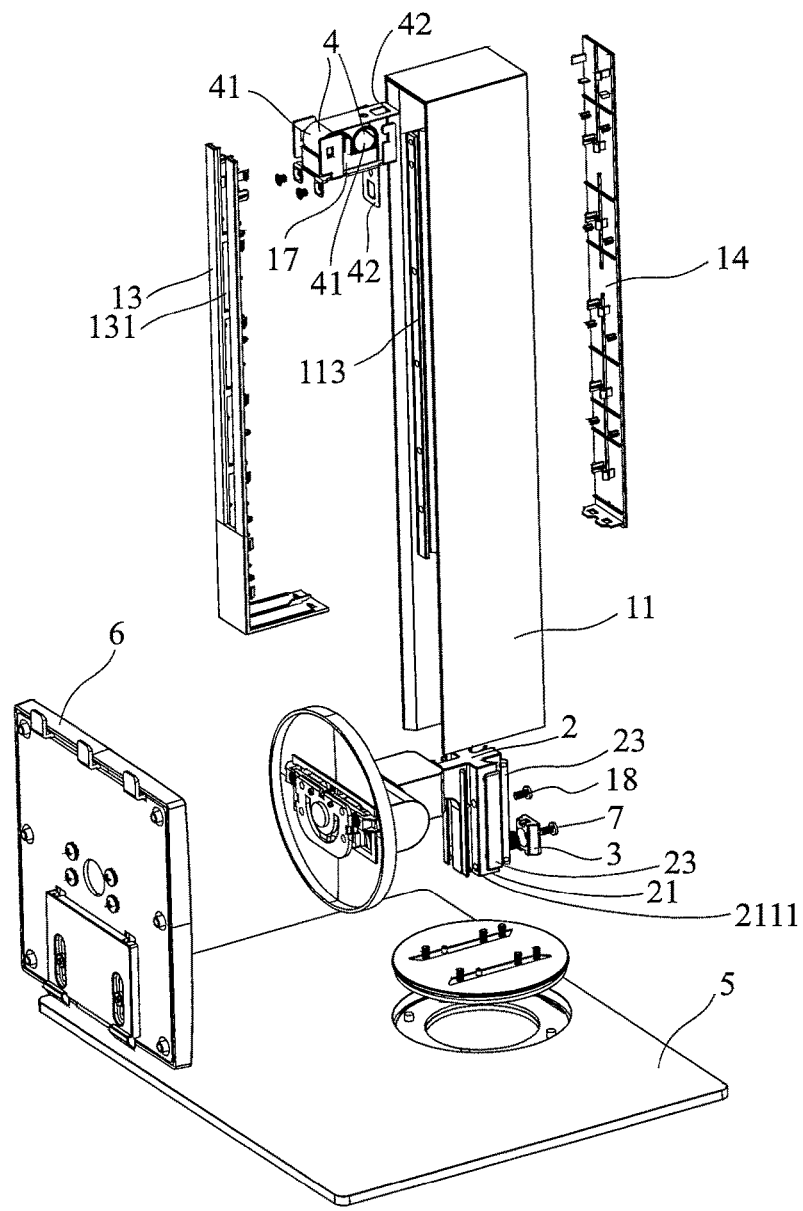
FIG. 2 is an explosive view of the supporting device of one embodiment of the present invention.

The supporting device 1000 of the present invention is illustrated in the perspective view of FIG. 1 and the explosive view of FIG. 2. The supporting device includes a support 1, a slider 2, a pressing block 3, two constant force springs 4, a base 5, and a connecting element 6. Wherein the support 1 is disposed on the base 5, the slider 2 is slidably disposed on the support 1 and protrudes out of the support 1 so as to be pivoted to the connecting element 6, and the connecting element 6 is provided for mounting a display device (not shown in the figures). The pressing block 3 is fastened on the slider 2. Two ends of each of the constant force springs 4 are fixed respectively to the support 1 and the slider 2.

The support 1 includes a shell 11, an accommodating space 12, a first plate 13, a second plate 14, a first opening 15, and a second opening 16.

Figure 3:
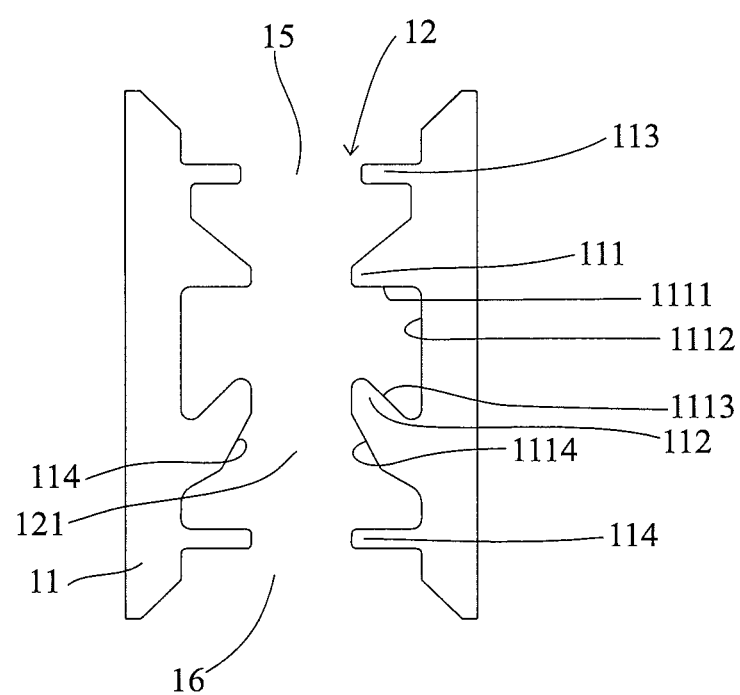
FIG. 3 is a cross-sectional view of a portion of the supporting device of one embodiment of the present invention.

Specifically, please refer to the partial cross-sectional bottom view of the support 1 illustrated in FIG. 3, the accommodating space 12, the first opening 15, and the second opening 16 are interconnected to each other. The shell 11 includes two first protruding ribs 111, two second protruding ribs 112, two third protruding ribs 113, and two fourth protruding ribs 114, which are protruded toward the accommodating space 12, and includes two first surfaces 1111, two second surfaces 1112, two third surfaces 1113, and two fourth surfaces 1114, which are corresponding to the accommodating space 12. The first surfaces 1111, the second surfaces 1112, and the third surfaces 1113 are sequentially connected, and the second surfaces 1112 are formed between the first protruding ribs 111 and the second protruding ribs 112, and the first surfaces 1111 are formed on the first protruding ribs 111 and adjacent to the second surfaces 1112, the third surfaces 1113 are formed on the second protruding ribs 112 and adjacent to the second surfaces 1112. Practically, the shell 11 is prepared through aluminum extrusion and bending. The preparation steps include forming an elongated plate with four protruding ribs through aluminum extrusion. The elongated plate is then bent after removing a portion of the protruding ribs.

The first plate 13, including an elongated opening 131, is disposed at the first opening 15 and engaged to the third protruding ribs 113, the second plate 14 is disposed at the second opening 16 and engaged to the fourth protruding ribs 114, in other words, the first plate 13 and the second plate 14 are located on the front side and the rear side of the shell 11 respectively.

Figure 4:
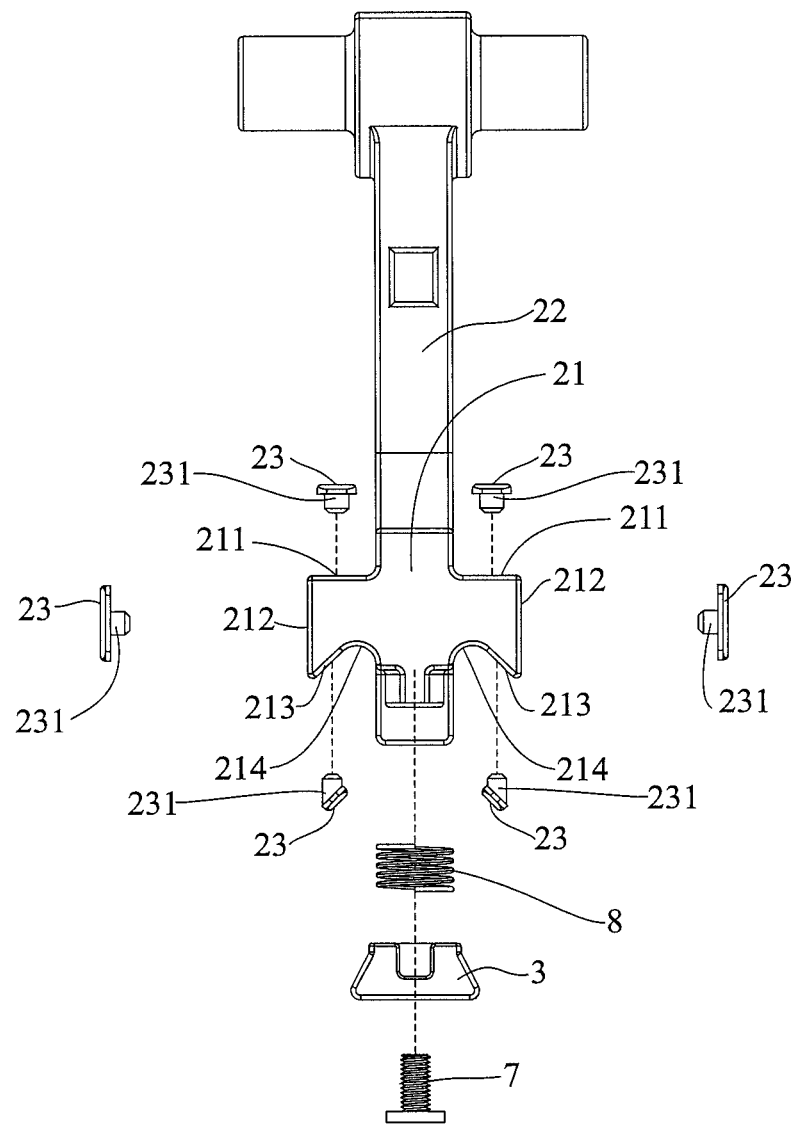
FIG. 4 is a bottom explosive view of the slider and the pressing block of one embodiment of the present invention.

Please refer to FIG. 4, the slider 2 includes a main part 21, an elongated arm 22, and six self-lubricating blocks 23, wherein the main part 21 is slidably disposed in the accommodating space 12, and the self-lubricating blocks 23 of the slider 2 are disposed between the main part 21 and the shell 11 respectively, and each of the self-lubricating blocks 23 contacts with the first surface 1111, the second surface 1112, and the third surface 1113 respectively; the elongated arm 22 is connected to the main part 21, protruding out of the support 1 through the first opening 15 and the elongated opening 131 of the first plate 13, and connected to the connecting base 6.

Further, the pressing block 3 is fastened to the main part 21 of the slider 2 through a bolt 7. A spring 8 (refer to FIG. 5) is further disposed between the pressing block 3 and the main part 21, the bolt 7 passes through the spring 8 and is fixed to the main part 21 so that the connection between the pressing block 3 and the main part 21 may be ensured by the spring 8.

More specifically, please refer to the cross-section view of the support 1 illustrated in FIG. 3. The second protruding ribs 112 of the shell 1 incline toward the first opening 15; therefore, a dovetail zone 121 is formed with respect to the fourth surfaces 1114. Please refer to the explosive view of the slider 2 and the pressing block 3 illustrated in FIG. 4, wherein the main part 21 includes symmetrical two front surfaces 211, two side surfaces 212, two inclined surfaces 213, and two concave surfaces 214. The front surfaces 211 face the first opening 15 and are adjacent to the elongated arm 22; the side surfaces 212 are adjacent to the front surfaces 211 and substantially perpendicular to the front surfaces 211; the inclined surfaces 213 are adjacent to the side surfaces 212, and an acute angle is formed between the inclined surface 213 and the side surface 212; the concave surfaces 214 are adjacent to the inclined surfaces 213 and corresponds to the second protruding ribs 112 of the shell 11.

Figure 5:
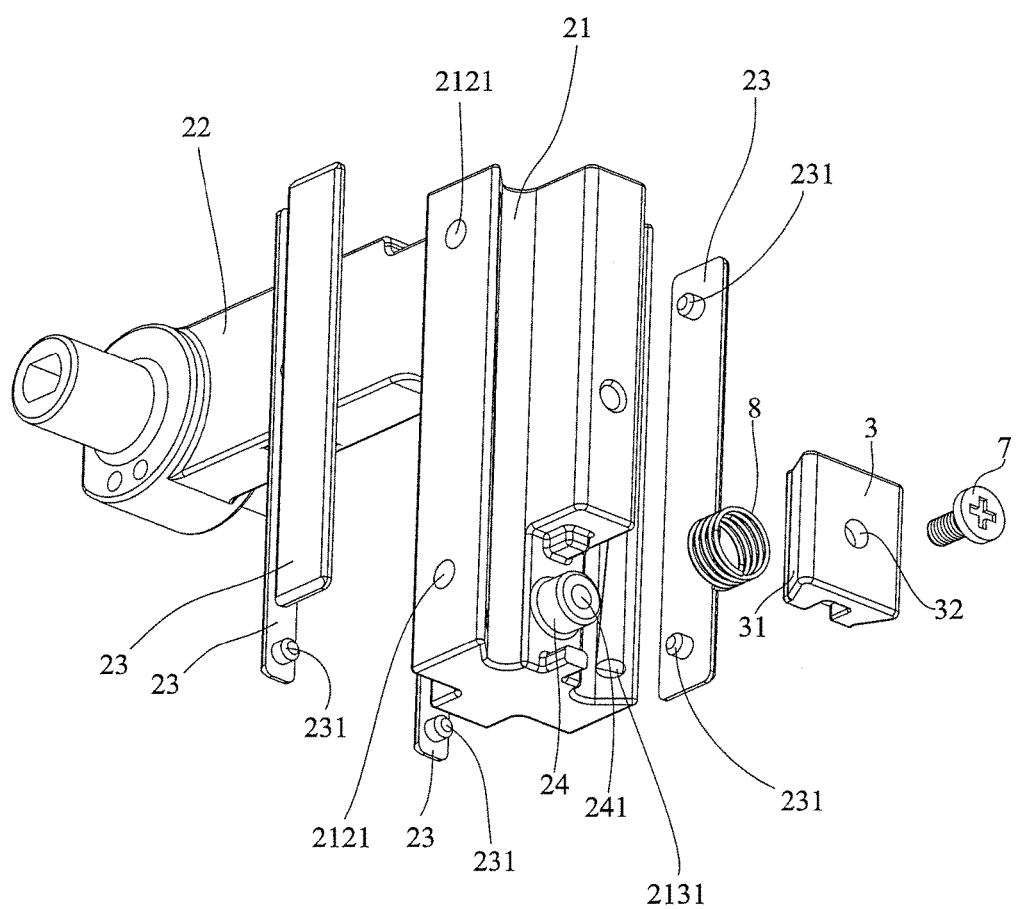
FIG. 5 is an explosive view of the slider and the pressing block of one embodiment of the present invention.

Also, the number of the self-lubricating blocks 23 is six, which are respectively disposed on the front surfaces 211, the side surfaces 212, and the inclined surfaces 213 of the main part 21. Specifically, in the slider 2, each of the front surfaces 211, the side surfaces 212, and the inclined surfaces 213 of the main part 21 further include two notches 2111, 2121, and 2131 respectively (as illustrated in FIG. 2 and FIG. 5). The self-lubricating blocks 23 disposed correspondingly to the front surfaces 211, the side surfaces 212, and the inclined surfaces 213 respectively include a bump 231 serving as an engaging structure. The notches 2111, 2121, 2131 engage to the bumps 231 which are correspondingly disposed. Therefore, those self-lubricating blocks 23 may be fixed firmly on the front surfaces 211, the side surfaces 212, and the inclined surfaces 213 of the main part 21. In the present embodiment, the self-lubricating blocks 23 are made of ultra-high molecular weight polyethylene (Lubmer L5000; Mitsui Chemicals, Inc.) which has a lower friction coefficient; thus the slider 2 may slide smoothly along the shell 11.

In another embodiment, however, the self-lubricating blocks 23 may be prepared through injection molding, and the plastic materials may be embedded into the notches 2111, 2121, 2131 of the front surfaces 211, the side surfaces 212, and the inclined surfaces 213 of the main part 21 to form the self-lubricating blocks 23 which are firmly engaged to the main part 21. Alternatively, in yet another embodiment, a plurality of bumps may be formed on the front surfaces 211, the side surfaces 212, and the inclined surfaces 213 of the main part 21, and the plastic material may cover the main part 21 of the slider 2 and surround those bumps through injection molding in order to form the self-lubricating blocks 23 engaging with the main part 21.

In addition, please refer to the explosive view illustrated in FIG. 5, the slider 2 further comprises a convex portion 24 formed at the concave portion 215 at the bottom of the main part 21, and the center of the convex portion 24 has a first screw hole 241. The spring 8 is sleeved to the convex portion 24. The pressing block 3 includes two side surfaces 31 and a through hole 32 and has a dovetailed cross-section. The bolt 7 passes the through hole 32 and the first screw hole 241 sequentially so that the pressing block 3 is bolted on the main part 21. Accordingly, the side surfaces 31 face toward and tightly press each of the fourth surfaces 1114 of the shell 11 respectively.

Figure 6:
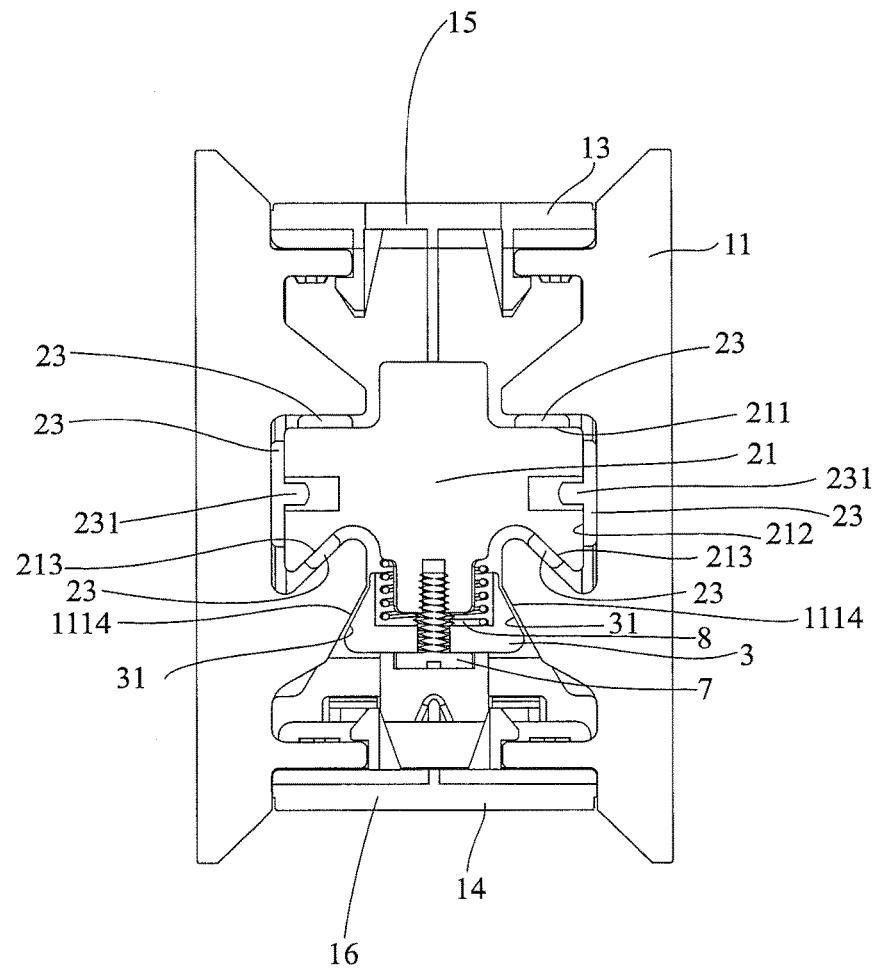
FIG. 6 is a cross-sectional view of the slider and the pressing block being disposed in the support of one embodiment of the present invention.

Please refer to FIG. 6 illustrating the cross-sectional view of the slider 2 and the pressing block 3 disposed in the support 1. The contour of the main part 21 conforms to the cross-section of the shell 11, and the self-lubricating blocks 23 disposed on the front surfaces 211, the side surfaces 212, and the inclined surfaces 213 of the main part 21 contact with the first surfaces 1111, the second surfaces 1112, and the third surfaces 1113 of the shell 11. The self-lubricating blocks 23 rub the first surfaces 1111, the second surfaces 1112, and the third surfaces 1113 of the shell 11 when the slider 2 slides up and down along the support 1. In other words, the similar effect of the slide and the slide rail may be achieved.

Also, when the pressing block 3 is fixed to the main part 21 of the slider 2, the side surfaces 31 of the pressing block 3 are tightly contacted to the fourth surfaces 1114 of the shell 11 and pull the slider 2 against shell 11 in a direction facing the second opening 16. Particularly, the contact between the self-lubricating blocks 23 and an inner surface of the shell 11 may be ensured by the tight contact between the third surfaces 1113 of the shell 11 and the corresponding self-lubricating blocks 23. In other words, due to the fine adjustment, the effect of the tolerance problems may be avoided. Also, the spring 8 disposed between the pressing blocks 3 and the main part 21 may serve as a buffer to keep the pressing blocks 3 and the main part 21 from sticking.

Furthermore, please refer to FIG. 2 again, each of the constant force springs 4 is applied as the elastic element of the present invention which has a winding portion 41 and a free end 42 corresponding to the winding portion 41. The winding portions 41 of the constant force springs 4 are accommodated on a supporting base 17 of the support 1, and the free ends 42 are fastened to the main part 21 of the slider 2 through a fastening member 18. As the slider 2 slides up and down, the distribution between the winding portion 41 and the free end 42 changes in order to provide a constant force so that the slider 2 will not be stuck on the support 1. In addition, the connecting base 6 is pivoted to the elongated arm 22 of the slider 2; accordingly, the connecting base 6 may rotate an angle with respect to the elongated arm 22 for adjusting the view angle of the display device (not shown in figures) mounted on the connecting base 6.

In another embodiment, the location of the constant force springs 4 in the support 1 is not particularly limited as long as the free ends 42 of the constant force springs 4 are fastened to the main part 21 of the slider 2 and may move with the slider 2. For example, the winding portions 41 of the constant force springs 4 may be vertically arranged or be disposed at any position of the support 1 and be supported by the supporting bases 17. Also, the number of the constant force springs 4 may be altered according to different situations.

Figure 7:
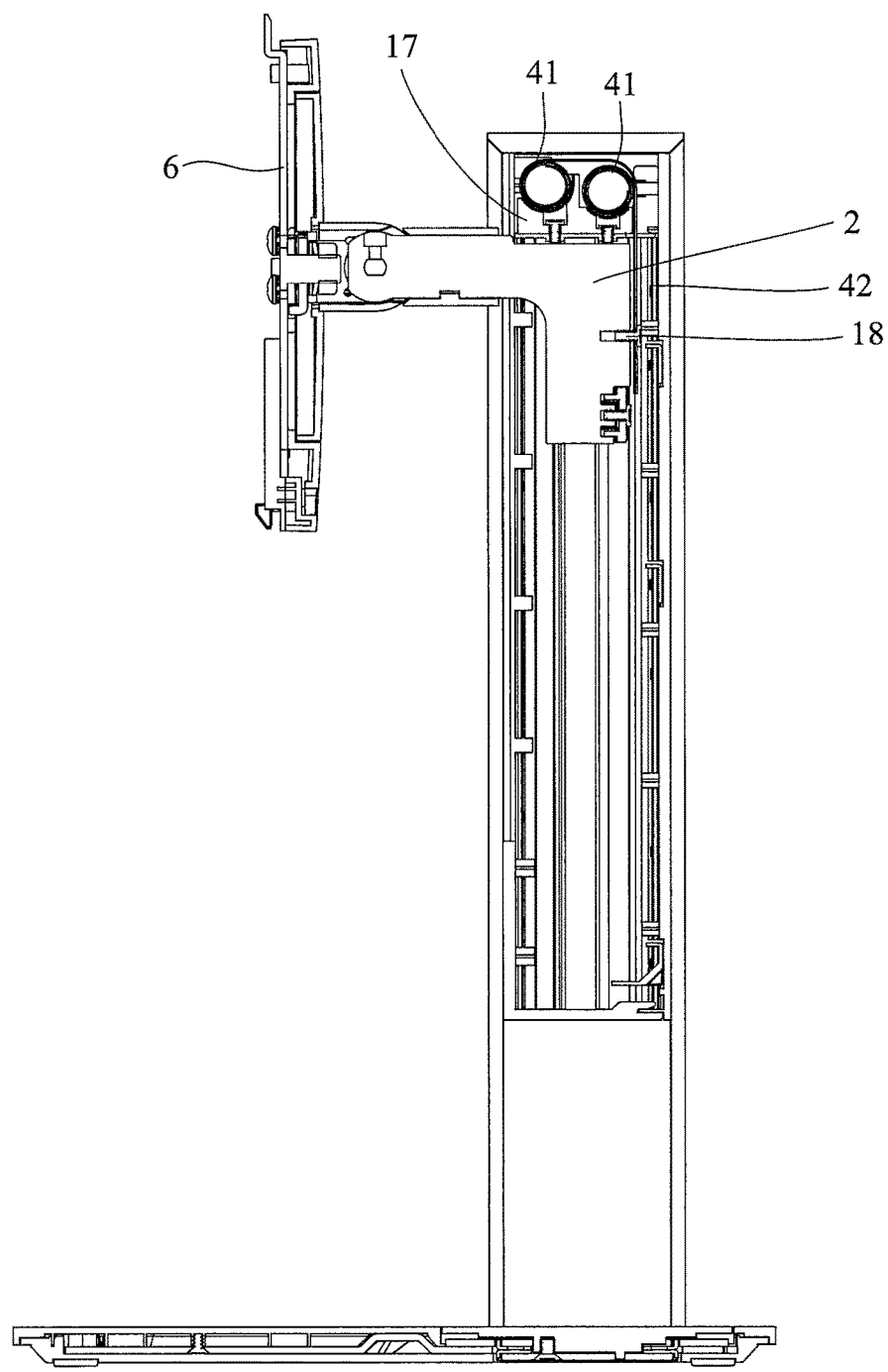
FIG. 7 is a schematic diagram of the supporting device with the slider at its highest position of one embodiment of the present invention.

Please refer to FIG. 7, which illustrates the cross-sectional view of the supporting device 1000 when the slider 2 is at a highest position. When the slider 2 is at the highest position, an elastic force provided by the constant force springs 4 is balanced with the weight of the slider 2, the connecting base 6, and the display device (not shown in figure) mounted on the connecting base 6 and the friction formed between the self-lubricating blocks 23 and the shell 11; therefore, the slider 2 may stop at the highest position.

Figure 8:
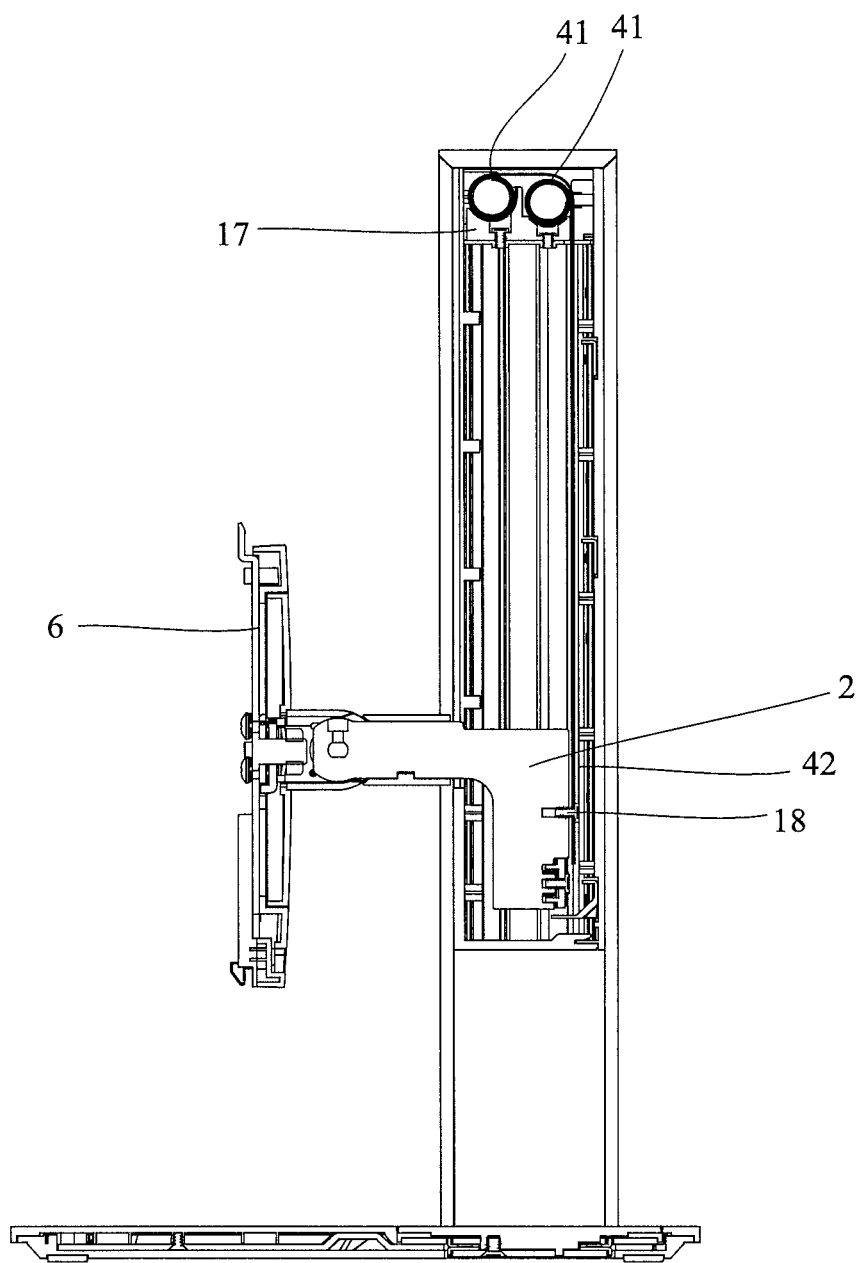
FIG. 8 is a schematic diagram of the supporting device with the slider at its lowest position of one embodiment of the present invention.

When a force is applied downwardly to the slider 2, the slider 2, the winding portions 42 of the constant force springs 4, the connecting base 6, and the display device may move downward simultaneously. The slider 2 moves downwardly along the shell 11 with the self-lubricating blocks 23 disposed on the surface of the main part 21. At the meantime, the length of the free ends 42 of the constant force springs 4 increases, that is, the length distributed in the free ends 42 increases and the length distributed in the winding portions 41 decreases. The elastic force still constantly provided by the constant force springs 4. Please refer to FIG. 8, when the force is removed, the elastic force provided by the constant force springs 4, the weight of the slider 2, the connecting base 6, and the display device (not shown in figures) mounted on the connecting base 6, and the friction formed between the self-lubricating blocks 23 and the shell 11 are balanced. Therefore, the display device may stop at any position with respect to the support 1.

On the contrary, when a force is applied upwardly to the slider 2, the slider 2, the self-lubricating blocks 23, the free ends 42 of the constant force springs 4, the connecting base 6, and the display device (not shown in figures) may move upward simultaneously. At the meantime, the slider 2 moves upwardly along the shell 11 with the self-lubricating blocks 23 disposed on the surface of the main part 21, and the free ends 42 of the constant force springs 4 rewind to the winding portions 41 and constantly provide the elastic force. When the force is removed, the elastic force provided by the constant force springs 4 may sustain the weight of the slider 2, the connecting base 6, and the display device mounted on the connecting base 6 so that the display device may stop at any height with respect to the support 1.

Although the present invention has been explained in relation to its preferred embodiment, it is to be understood that many other possible modifications and variations can be made without departing from the spirit and scope of the invention as hereinafter claimed.

What is claimed is:

1. A supporting device, comprising:
    a support including a shell, an accommodating space, a first opening, and a second opening, wherein the shell surrounds the accommodating space, the first opening and the second opening face opposite directions and interconnect with the accommodating space, the shell includes a first protruding rib, a second protruding rib, a first surface, a second surface, and a third surface corresponding to the accommodating space, wherein the first protruding rib and the second protruding rib protrude toward the accommodating space, the first surface, the second surface, and the third surface are sequentially connected, the second surface is formed between the first protruding rib and the second protruding rib, the first surface is formed on the first protruding rib and adjacent to the second surface, and the third surface is formed on the second protruding rib and adjacent to the second surface;

a slider including a main part, an elongated arm, and at least one self-lubricating block, wherein the main part is disposed between the first protruding rib and the second protruding rib, the self-lubricating block is disposed between the main part and the shell and contacts with the shell, and the elongated arm is connected to the main part and protrudes out of the support through the first opening; and an elastic element being disposed between the slider and the support;

wherein when a force is applied to the slider, the self-lubricating block rubs the support so that the slider slides between a highest position and a lowest position with respect to the support, and the slider stops at any height with respect to the support when the force is removed.

2. The supporting device as claimed in claim 1, wherein the self-lubricating block contacts with the first surface, the second surface, or the third surface of the support.

3. The supporting device as claimed in claim 1, further comprising a pressing block disposed at a dovetail zone of the accommodating space, wherein the dovetail zone is adjacent to the second opening and tapered toward the first opening, and the shell further includes two fourth surfaces which correspond to the dovetail zone and oppose to each other.

4. The supporting device as claimed in claim 3, wherein the pressing block abuts against the fourth surfaces of the shell and is fixed to the main part of the slider through a connecting element so that the self-lubricating block tightly abuts against the shell.

5. The supporting device as claimed in claim 4, wherein the connecting element is a bolt, the bolt passes through the pressing block and plugs into the main part of the slider.

6. The supporting device as claimed in claim 5, further comprising a spring being disposed between the pressing block and the slider.

7. The supporting device as claimed in claim 6, wherein the slider further includes a convex portion, wherein the convex portion is formed on a concave portion at the bottom of the main part for the spring being sleeved thereon.

8. The supporting device as claimed in claim 1, wherein the support further comprises a first plate being disposed at the first opening, the shell further comprises a third protruding rib being adjacent to the first opening, wherein the first plate is engaged to the third protruding rib.

9. The supporting device as claimed in claim 1, wherein the support further comprises a second plate being disposed at the second opening, the shell further comprises a fourth protruding rib being adjacent to the second opening, wherein the second plate is engaged to the fourth protruding rib.

10. The supporting device as claimed in claim 1, wherein the elastic element is a constant force spring having a winding portion and a free end corresponding to the winding portion, the support further comprises a supporting base, wherein the winding portion is accommodated on the supporting base and the free end is fixed to the slider and moves along with the slider.

11. The supporting device as claimed in claim 1, wherein the support is an elongated plate prepared through aluminum extrusion and bending, wherein the elongated plate includes a plurality of protruding ribs which are integrally formed.

12. The supporting device as claimed in claim 1, wherein the main part further includes at least one engaging structure, the self-lubricating block is embedded in the engaging structure so that the self-lubricating block is engaged with the main part.

13. The supporting device as claimed in claim 1, further comprising a connecting base being pivoted with the slider so that the connecting base is rotatable with respect to the slider.

14. The supporting device as claimed in claim 1, wherein a material of the self-lubricating block is selected from the group consisting of polyaryletherketone, polyethylene, and modified polyethylene.

\* \* \* \* \*